United States Patent
Ankamreddi et al.

(10) Patent No.: US 10,459,468 B1
(45) Date of Patent: Oct. 29, 2019

(54) LOAD CURRENT SENSE CIRCUIT

(71) Applicant: TEXAS INSTRUMENTS INCORPORATED, Dallas, TX (US)

(72) Inventors: Ramakrishna Ankamreddi, Bengaluru (IN); Saurabh Rai, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/252,041

(22) Filed: Jan. 18, 2019

Related U.S. Application Data

(60) Provisional application No. 62/787,051, filed on Dec. 31, 2018.

(30) Foreign Application Priority Data

Oct. 24, 2018 (IN) .............................. 201841040077

(51) Int. Cl.
*G05F 1/573* (2006.01)
*H03K 17/082* (2006.01)
*G01R 19/00* (2006.01)

(52) U.S. Cl.
CPC ......... *G05F 1/573* (2013.01); *G01R 19/0092* (2013.01); *H03K 17/0822* (2013.01)

(58) Field of Classification Search
CPC .. G05F 1/573; G01R 19/0092; H03K 17/0822
See application file for complete search history.

(56) References Cited

U.S. PATENT DOCUMENTS

| | | | | |
|---|---|---|---|---|
| 6,188,211 B1* | 2/2001 | Rincon-Mora | ......... | G05F 1/575 323/273 |
| 6,188,212 B1* | 2/2001 | Larson | ....................... | G05F 1/56 323/274 |
| 6,507,227 B2* | 1/2003 | Genova | ............ | G01R 19/16519 327/100 |
| 6,522,111 B2* | 2/2003 | Zadeh | ...................... | G05F 1/575 323/277 |
| 7,365,559 B2* | 4/2008 | Colbeck | ............. | G01R 19/0092 324/762.09 |

(Continued)

OTHER PUBLICATIONS

Brata, R. et al. "Integrated Current Sensor for Automotive Power Switches." Proc. 3oth International Conference on Microelectronics (MIEL 2017), NIS, Serbia, Oct. 9-11, 2017, pp. 113-116.

*Primary Examiner* — Emily P Pham
(74) *Attorney, Agent, or Firm* — Tuenlap Chan; Charles A. Brill; Frank D. Cimino

(57) ABSTRACT

A current sensing circuit includes a pass transistor, a first sense transistor, a second sense transistor, a driver circuit, and sense circuitry. The driver circuit coupled to, and configured to generate a drive signal to control, the pass transistor, the first sense transistor, and the second sense transistor. The sense circuitry coupled to the pass transistor, the first sense transistor, and the second sense transistor. The sense circuitry includes a first sense circuit and a second sense circuit. The first sense circuit is configured to generate an output current proportional to a current flowing in the pass transistor. The second sense circuit is coupled to the driver circuit and is configured to set the drive signal to a predetermined voltage responsive to a voltage across the pass transistor being less than a threshold voltage.

20 Claims, 4 Drawing Sheets

(56) References Cited

U.S. PATENT DOCUMENTS

| 7,551,027 | B2 * | 6/2009 | Salove | H03F 3/19 |
| | | | | 330/140 |
| 7,868,643 | B2 | 1/2011 | Kadow et al. | |
| 9,791,480 | B2 * | 10/2017 | Qin | G01R 19/0092 |

* cited by examiner

LOAD CURRENT SENSE CIRCUIT

CROSS-REFERENCE TO RELATED APPLICATIONS

This application claims priority to India Provisional Patent App. No. 201841040077 filed Oct. 24, 2018 and U.S. Provisional Patent App. No. 62/787,051 filed Dec. 31, 2018, which are incorporated herein by reference.

BACKGROUND

In integrated circuits, it is often desirable to monitor the current flowing through a particular device. For example, an output transistor may require current limiting to protect the device and/or the load circuit in the event that a fault develops in the load circuit. In another example, an integrated circuit may provide, to an external monitoring circuit, a measurement of current flowing to a load circuit. Various methods of measuring the current flowing through a device are available. Such methods include measuring voltage drop across a sense resistor in series with the device, which can be inefficient, and generating a sense current that is proportional to the current flowing in the device and measuring the sense current.

SUMMARY

A current sensing circuit that includes a sensing loop for controlling the channel resistance of a pass transistor is disclosed herein. The channel resistance is maintained at a value that provides a voltage across the pass transistor that is greater than the offset of the sense amplifier applied to sense the current flow in the pass transistor. In one example, a low dropout regulator circuit includes a pass transistor, a first sense transistor, a second sense transistor, a driver circuit, sense circuitry, and an error amplifier. The driver circuit is coupled to, and configured to generate a drive signal to control, the pass transistor, the first sense transistor, and the second sense transistor. The sense circuitry is coupled to the pass transistor, the first sense transistor, and the second sense transistor. The sense circuitry includes a first sense circuit and a second sense circuit. The first sense circuit is configured to generate an output current proportional to a current flowing in the pass transistor. The second sense circuit is coupled to the driver circuit and is configured to set the drive signal to a predetermined voltage responsive to a voltage across the pass transistor being less than a threshold voltage. The error amplifier is coupled to the pass transistor and the driver circuit, and is configured to control a voltage at an output of the pass transistor.

In another example, a current sensing circuit includes a pass transistor, a first sense transistor, a second sense transistor, a driver circuit, and sense circuitry. The driver circuit is coupled to, and configured to generate a drive signal to control, the pass transistor, the first sense transistor, and the second sense transistor. The sense circuitry is coupled to the pass transistor, the first sense transistor, and the second sense transistor. The sense circuitry includes a first sense circuit and a second sense circuit. The first sense circuit is configured to generate an output current proportional to a current flowing in the pass transistor. The second sense circuit is coupled to the driver circuit and is configured to set the drive signal to a predetermined voltage responsive to a voltage across the pass transistor being less than a threshold voltage.

In a further example, a current sensing circuit includes a first transistor, a second transistor, a third transistor, a driver circuit, a first sense circuit, and a second sense circuit. The second transistor, includes a first terminal and a second terminal. The first terminal is coupled to a first terminal of the first transistor. The second terminal is coupled to a second terminal of the first transistor. The third transistor includes a first terminal and a second terminal. The first terminal of the third transistor is coupled to the first terminal of the first transistor. The second terminal of the third transistor is coupled to the second terminal of the first transistor. The driver circuit includes a first terminal that is coupled to the first terminal of the first transistor. The first sense circuit includes a first terminal and a second terminal. The first terminal of the first sense circuit is coupled to a third terminal of the first transistor. The second terminal of the first sense circuit is coupled to a third terminal of the second transistor. The second sense circuit includes a first terminal, a second terminal, and a third terminal. The first terminal of the second sense circuit is coupled to the third terminal of the first transistor. The second terminal of the second sense circuit is coupled to a third terminal of the third transistor. The third terminal of the second sense circuit is coupled to a second terminal of the driver circuit.

BRIEF DESCRIPTION OF THE DRAWINGS

For a detailed description of various examples, reference will now be made to the accompanying drawings in which.

DETAILED DESCRIPTION

Figure 1:
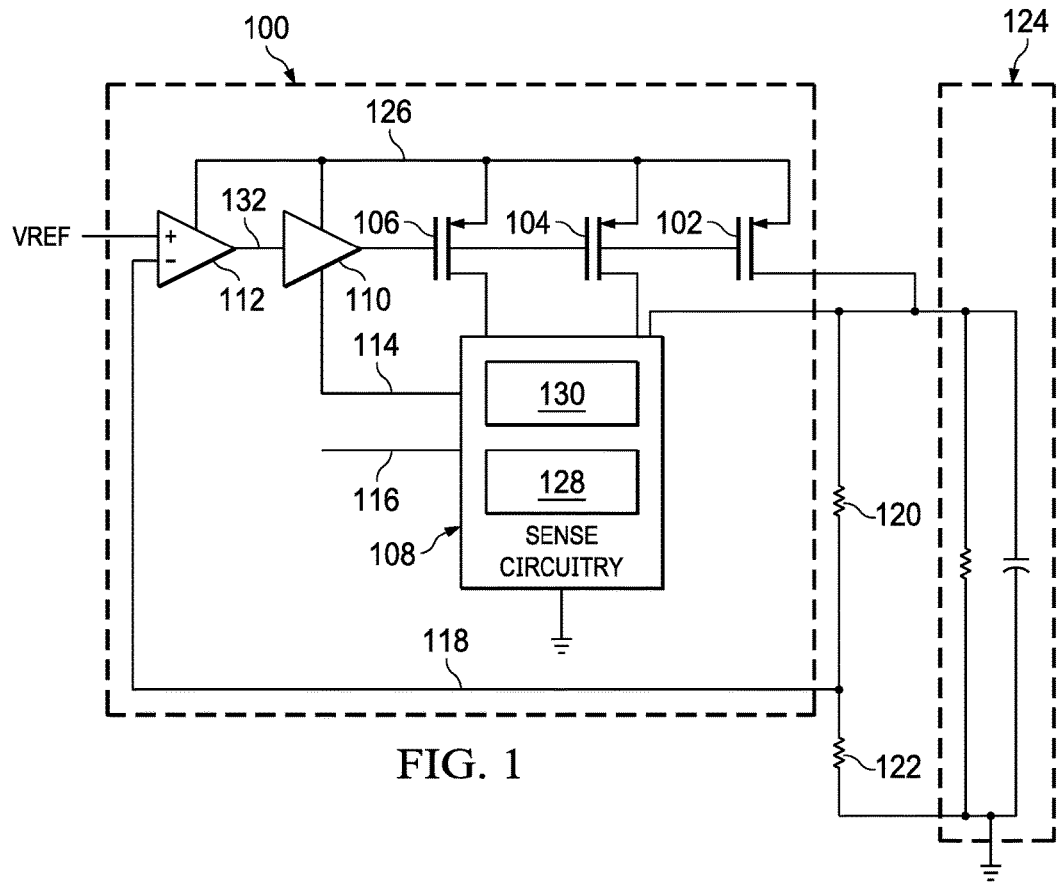
FIG. 1 shows a schematic diagram for an example low drop out regulator that includes sense circuitry to control pass transistor voltage in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." The recitation "based on" is intended to mean "based at least in part on." Therefore, if X is based on Y, X may be a function of Y and any number of other factors.

In a circuit that monitors current flowing to a load, a sense transistor may be employed to reduce the losses associated with the monitoring. The sense transistor is used to generate a sense current that is proportional to the current flowing through a pass transistor to a load circuit by equalizing the voltage across the pass transistor and the sense transistor while providing a same control signal to the pass and sense transistors.

Sense circuitry that controls the voltage drop across the sense transistor includes a sense amplifier that compares the voltage drop across the pass transistor to the voltage drop across the sense transistor. When the pass transistor is operating in the linear region, the voltage across the pass transistor is proportional to the load current. Under light load conditions, the voltage across the pass transistor may be comparable to or less than the offset voltage of the sense amplifier, which prevents the amplifier from accurately measuring the difference in the voltage across the pass and sense transistors and causes inaccurate measurement of the current flowing in the pass transistor.

The sense circuitry of the present disclosure provides sense currents that are accurately proportional to load current when the pass transistor is operating in either the linear region or in saturation. The sense circuitry disclosed herein includes a second sense transistor and associated sense circuit that maintain a predetermined finite on-channel resistance for the pass transistor when the pass transistor is operating in dropout (linear region) while carrying very light loads. As the load current increases, the on-channel resistance is reduced to support a very low dropout voltage. The predetermined finite on-channel resistance ensures that the drain-to-source voltage across the pass transistor is greater than the offset voltage of the sense amplifier even for light loads when operating in dropout, and therefore allows the sense amplifier to properly equalize the voltage across the pass and sense transistors and provide accurate current measurements under all operational and loading conditions. The sense circuitry also helps to reduce no load dropout quiescent current as minimum current flows at no load condition and increases with load. The sense circuitry described herein is suitable for use in a variety of applications that apply a sense transistor to measure the current flowing in a pass transistor, including low drop out voltage regulators, electronic fuses, and current limit switches.

FIG. 1 shows a schematic diagram for an example low drop out regulator 100 that includes sense circuitry to control pass transistor voltage in accordance with the present disclosure. The low drop out regulator 100 includes a pass transistor 102, a sense transistor 104, a sense transistor 106, sense circuitry 108, a driver circuit 110, and an error amplifier 112. The pass transistor 102, the sense transistor 104, and the sense transistor 104 may be negative (N) channel metal oxide semiconductor field effect transistors (MOSFETs) or positive P channel MOSFETs in various implementations of the low drop out regulator 100. The sense transistor 104 and the sense transistor 106 may downscaled versions of the pass transistor 102. For example, the channel width of the sense transistor 104 and the sense transistor 106 may hundreds or thousands of time smaller than the channel width of the pass transistor 102.

Current flowing through the pass transistor 102 powers a load circuit 124. The pass transistor 102, the sense transistor 104 and the sense transistor 106 are driven in parallel by the driver circuit 110. The pass transistor 102, the sense transistor 104 and the sense transistor 106 are coupled to the power rail 126 and to the sense circuitry sense circuitry 108. The pass transistor 102 is also coupled to the error amplifier 112 via a voltage divider formed by the resistor 120 and the resistor 122. The error amplifier 112 generates an error signal 132 representative of the difference in a reference voltage and the feedback voltage 118 generated from the output voltage of the pass transistor 102. The error signal 132 is provided to the driver circuit 110 and driven by the driver circuit 110 as a control voltage to the pass transistor 102, the sense transistor 104, and the sense transistor 106.

The sense circuitry 108 includes a sense circuit 128 and a sense circuit sense circuit 130. The sense circuit 128 is coupled to the pass transistor 102 and the sense transistor 104, and generates a sense current 116 that is proportional to the current flowing in the pass transistor 102. The sense circuit 130 is coupled to the pass transistor 102 and the sense transistor 106 and generates a control current 114 that controls the driver circuit 110. Based on the voltage across the pass transistor 102, the sense circuit 130 via the control current 114, sets the control voltage (gate to source voltage) provided to the pass transistor 102 to a predetermined value, which in turn sets the on-channel resistance of the pass transistor 102. As loading increases, which increases the voltage across the pass transistor 102, the sense circuit 130 via the control current 114 changes the control voltage (gate to source voltage across the pass transistor 102) according to load current.

The sense circuit 130 compares the drain-to-source voltage (VIN-VOUT) across the pass transistor 102 to a threshold voltage (VOFS shown in FIG. 2) that is greater than the offset voltage of a sense amplifier of the sense circuit 128. If the voltage across the pass transistor 102 is less than the threshold voltage, then the sense circuit 130 generates the control current 114 as a predetermined fixed current selected to set the channel resistance of the pass transistor 102 to a predetermined relatively high value. Under such conditions, the error amplifier 112 may not able to bring the low drop out regulator 100 into regulation (i.e., the low drop out regulator 100 is in dropout).

If the voltage across the pass transistor 102 is greater than the threshold voltage, then the sense circuit 130 generates the control current 114 as a sum of the predetermined fixed current and current that increases in proportion to the current flowing in the pass transistor 102. Thus, if the voltage across the pass transistor 102 is greater than the threshold voltage, the control current 114 increases in proportion to the current in the pass transistor 102.

By controlling the resistance of the pass transistor 102 (and thereby the voltage across the pass transistor 102) under conditions where the error amplifier 112 is unable to bring the low drop out regulator 100 into regulation, the sense circuit 130 allows the sense circuit 128 provide an accurate measurement of current flowing in the pass transistor 102. Furthermore, because the driver circuit 110 is controlled by the sense circuit 130 rather than the error amplifier 112 when the pass transistor 102 is operating in dropout region, the quiescent current flowing in the driver circuit 110 is less than the current that would flow in the driver circuit 110 during dropout if controlled by the error amplifier 112. When the pass transistor 102 is not in dropout mode (i.e., in regulation mode), the driver circuit 110 is controlled by the error amplifier 112.

Figure 2:
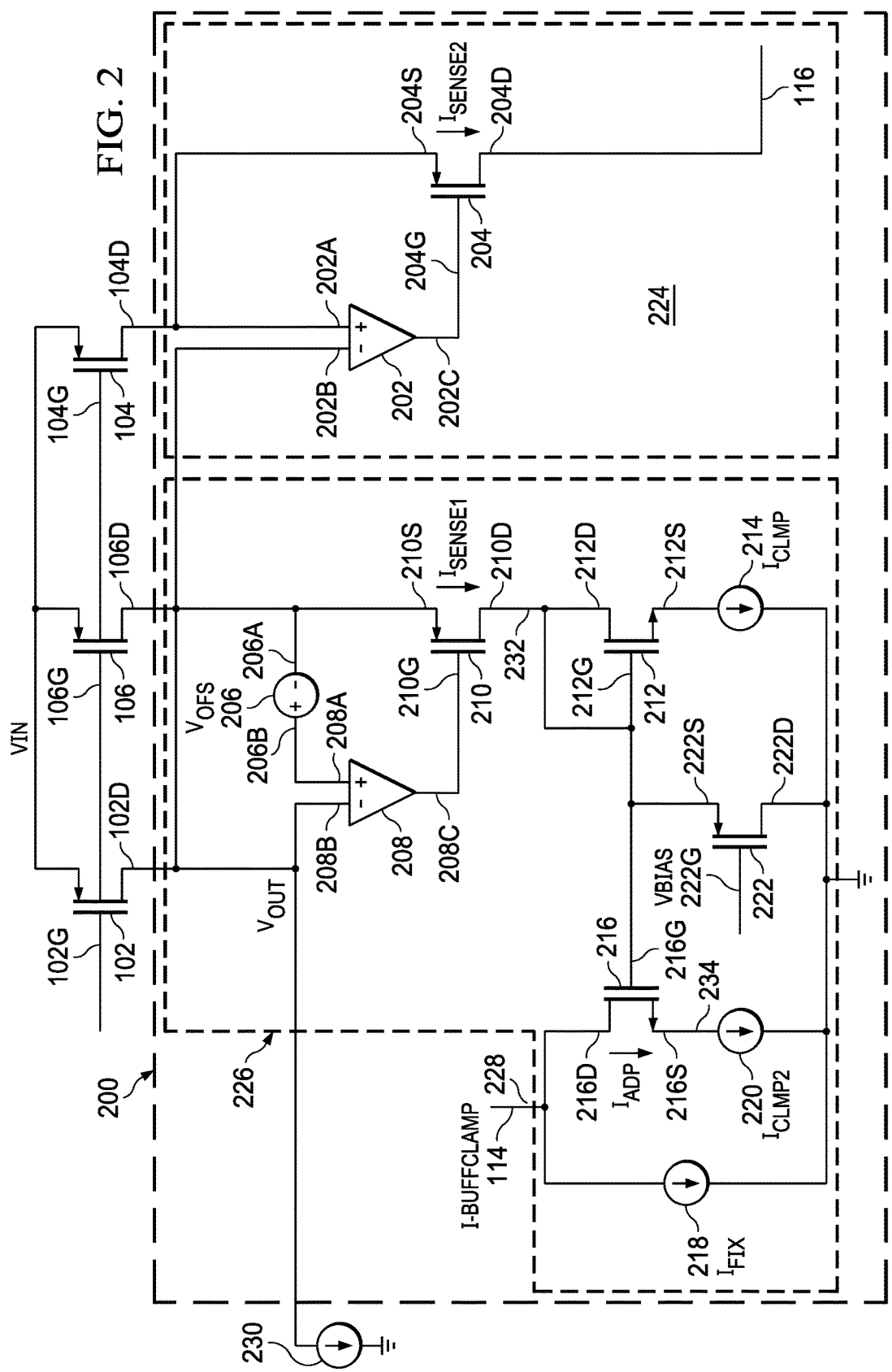
FIG. 2 shows a schematic diagram for an example of sense circuitry that controls pass transistor voltage in accordance with the present disclosure.

FIG. 2 shows a schematic diagram for an example of sense circuitry 200 that controls pass transistor voltage in accordance with the present disclosure. The sense circuitry 200 is an implementation of the sense circuitry 108. The sense circuitry 200 includes a sense circuit 224 and a sense circuit sense circuit 226. The sense circuit 224 is an implementation of the sense circuit 128, and the sense circuit 226 is an implementation of the sense circuit 130. The pass transistor 102, the sense transistor 104, and the sense transistor 106 are shown in FIG. 2 to provide context.

The sense circuit 224 includes a sense amplifier 202 and a transistor 204 coupled to the sense amplifier 202. The sense amplifier 202 is coupled to the pass transistor 102 and the sense transistor 104. The sense amplifier 202 compares the voltages at the outputs of the pass transistor 102 and the sense transistor 104, and drives the transistor 204 to make the voltage on the output of the sense transistor 104 equal to the voltage on the output of the pass transistor 102. The sense amplifier 202 includes an input terminal 202A, and input terminal 202B, and an output terminal 202C. The input terminal 202A is coupled to the drain terminal 104D of the sense transistor 104. The input terminal 202B is coupled to the drain terminal 102D of the pass transistor 102. The transistor 204 includes a gate terminal 204G, a source terminal 204S, and a drain terminal 204D. The output terminal 202C of the sense amplifier 202 is coupled to the gate terminal 204G of the transistor 204. The source terminal 204S of the transistor 204 is coupled to the input terminal 202A of the sense amplifier 202 and to the drain terminal 104D of the sense transistor 104. The drain terminal 204D provides the sense current 116.

The sense circuit 226 includes an offset voltage source 206, a sense amplifier 208, a transistor 210, a transistor 212, a transistor 216, a transistor 222, a current source 214, a current source 218, and a current source 220. The offset voltage source 206 adds an offset voltage to the voltage at the output of the sense transistor 106. The offset voltage generated by the offset voltage source 206 is larger than that offset voltage generated in the sense amplifier 202. In some implementations of the sense circuit 226, the offset voltage source 206 may be implemented as a resistor. The sense amplifier 208 compares the voltage at the output of the pass transistor 102 and the voltage at the output of the sense transistor 106 as offset by the offset voltage source 206, and drives the transistor 210 to equalize the voltages at the inputs of the sense amplifier 208. If the voltage at the output of the pass transistor 102 is less than the voltage at the output of the sense transistor 104 plus the offset voltage generated by the offset voltage source 206, then the sense amplifier 208 turns off the transistor 210, and no current flows in the transistor 210. As the voltage across the pass transistor 102 increases and becomes greater than the offset voltage generated by the offset voltage source 206, the sense amplifier 208 turns on the transistor 210 and current flows through the transistor 210. When the pass transistor 102 is operating in the linear region, the current through the transistor 210 is:

$$I_{SENSE1} = \frac{I_{LOAD}}{K\left(1 - \frac{V_{OFS}}{V_{IN} - V_{OUT}}\right)}$$

where:
$I_{SENSE1}$ is the current flowing in the 210;
$I_{LOAD}$ is the current flowing in the pass transistor 102;
K is the sense transistor 106 to pass transistor 102 scale factor;
$V_{OFS}$ is the offset voltage generated by the 206;
$V_{IN}$ is the voltage on the power rail 126; and
$V_{OUT}$ is the voltage on the drain of the pass transistor 102.

When the pass transistor 102 is operating in saturation ($V_{IN}-V_{OUT} \gg V_{OFS}$), the current through the transistor 210 is:

$$I_{SENSE1} = \frac{I_{LOAD}}{K}$$

The sense amplifier 208 includes an input terminal 208A, and input terminal 208B, and an output terminal 208C. The offset voltage source 206 includes an input terminal 206A and an output terminal 206B. The input terminal 208A of the sense amplifier 208 is coupled to the output terminal 206B of the offset voltage source 206, and the input terminal 206A of the offset voltage source 206 is coupled to the drain terminal 106D of the sense transistor 106. The input terminal 208B of the sense amplifier 208 is coupled to the drain terminal 102D of the pass transistor 102. The transistor 210 includes a gate terminal 210G, a source terminal 210S, and a drain terminal 210D. The output terminal 208C of the sense amplifier 208 is coupled to the gate terminal 210G of the transistor 210. The source terminal 210S of the transistor 210 is coupled to the input terminal 206A of the offset voltage source 206 and the drain terminal 106D of the sense transistor 106.

The transistor 212 and the transistor 216 form a current mirror that reflects the current flowing through the transistor 212 in the transistor 216. In this implementation, current flowing in the transistor 210, as described above, flows through the transistor 212 and is restricted to an upper limit controlled by (i.e., clamped by) the current source 214. Similarly, the current flowing in the transistor 216 is restricted to an upper limit controlled by (i.e., clamped by) the current source 220. The current source 214 and the current source 220 are included to clamp the gate-to-source voltage of the pass transistor 102 to a device-dependent limit. The transistor 222 clamps the gate terminal 212G of transistor 212 and the gate terminal 216G of the transistor 216 to the voltage VBIAS+(gate-source voltage of the transistor 222) when the current flowing in the transistor 212 is clamped by the current source 214 and the current flowing in the transistor 216 is clamped by the current source 220. Some implementations of the 200 may not include the clamping shown in FIG. 2, and may omit the transistor 222, the current source 214, and/or the current source 220.

The sense circuit 226 includes a terminal 228 that is coupled to the current source 218 and the transistor 216. The current source 218 is a fixed current source that generates a fixed predetermined current flow in the terminal 228. The transistor 216 and other components of the sense circuit 226 form a variable current source that generates a current proportional to the current flowing in the pass transistor 102 if the voltage across the pass transistor 102 exceeds the offset voltage generated by the offset voltage source 206. The currents generated by the current source 218 and the current flowing in the transistor 216 are summed in the terminal 228. The fixed current generated by the current source 218 sets minimum current flow in the terminal 228. The maximum current (i.e., the predetermined maximum current) flow in the terminal 228 is equal to the sum of the current generated by the current source 218 and the maximum current of the current source 220. When the voltage across the pass transistor 102 is less than the offset voltage generated by the pass transistor 102, the current in the terminal 228 is only the current generated by the current source 218. The current generated by the current source 218 causes the driver circuit 110 to set the resistance of the pass transistor 102 so that the voltage across the 102 is greater than the offset voltage generated in the sense amplifier 202, which allows the sense amplifier 202 to accurately measure the current flowing in the pass transistor 102. When the voltage across the pass transistor 102 is greater than the offset voltage generated by the pass transistor 102, the current in the terminal 228 is the sum of the current generated by the current source 218 and the current flowing through the transistor 216. The control current 114 is the current flowing in the terminal 228.

The transistor 212 includes a gate terminal 212G, a source terminal 212S, and a drain terminal 212D. The drain terminal 212D of the transistor 212 is coupled to the gate terminal 212G of the transistor 212 and to the drain terminal 210D of the transistor 210. The source terminal 212S of the transistor 212 is coupled to the current source 214. The transistor 216 includes a gate terminal 216G, a source terminal 216S, and a drain terminal 216D. The gate terminal 216G of the transistor 216 is coupled to the gate terminal 212G of the transistor 212. The source terminal 216S of the transistor 216 is coupled to the current source 220. The drain terminal 216D of the transistor 216 is coupled to the terminal 228. The transistor 222 includes a source terminal 222S, a drain terminal 222D, and a gate terminal 222G. The source terminal 222S of the transistor 222 is coupled to the gate terminal 212G of the transistor 212 and the gate terminal 216G of the transistor 216. The drain terminal 222D of the transistor 222 is coupled to ground. The gate terminal 222G of the transistor 222 is coupled a bias voltage source.

Figure 3:
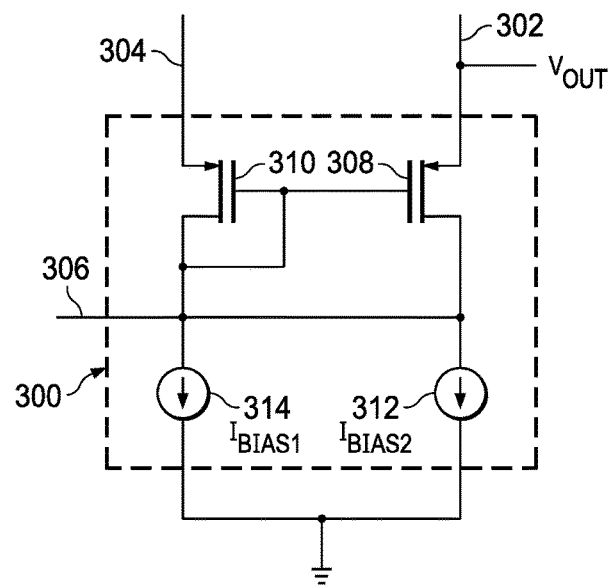
FIG. 3 shows a schematic diagram for an example sense amplifier suitable for use in the sense circuitry of FIG. 2.

FIG. 3 shows a schematic diagram for an example sense amplifier 300 suitable for use in the sense circuitry 200. The sense amplifier 300 is an implementation of the sense amplifier 202 or the sense amplifier 208. The sense amplifier 300 includes an input terminal 302, an input terminal 304, an output terminal 306, a transistor 308, a transistor 310, a current source 312, and a current source 314. The input terminal 302 corresponds to the input terminal 202B of the sense amplifier 202, the input terminal 304 corresponds to the input terminal 202A of the sense amplifier 202, and the output terminal 306 corresponds to the output terminal 202C of the sense amplifier 202. The source terminal of the transistor 308 is coupled to the input terminal 302. The drain terminal of the transistor 308 is coupled to the current source 312 and the output terminal 306. The gate terminal of the transistor 308 is coupled to the gate terminal of the transistor 310 and the drain terminal of the transistor 310. The drain terminal of the transistor 310 is coupled to the current source 314. The source terminal of the transistor 310 is coupled to the input terminal 304.

Some implementations of the sense amplifier 300 include the offset voltage source 206. For example, the offset voltage source 206 may be implemented in the sense amplifier 300 by making the transistor 308 and the transistor 310 of different size.

Figure 4:
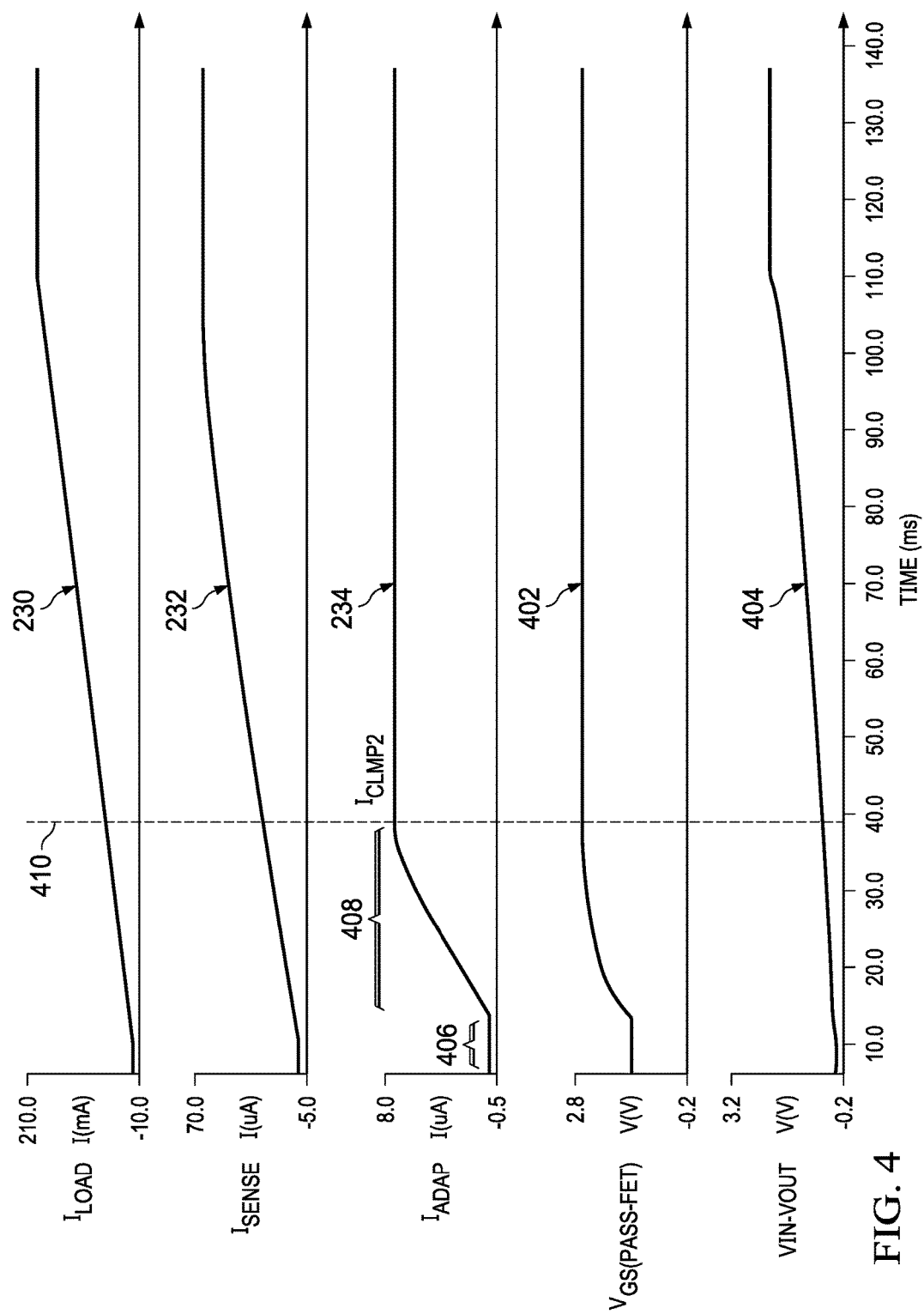
FIG. 4 shows signals of the sense circuitry of FIG. 2 when employed in a low drop out regulator that is operating in the drop out region.

FIG. 4 shows signals in the sense circuitry 200 when employed in a low drop out regulator 100 that is operating in the drop out region. In FIG. 4, the current 230 flowing in the pass transistor 102 is rising which causes the voltage 404 across the pass transistor 102 to increase. In the interval 406, the voltage 404 across the pass transistor 102 is less than the offset voltage generated by the offset voltage source 206, and the current source 218 alone sets the control current 114 for controlling the resistance of the pass transistor 102 (i.e., no current 234 flows in the transistor 216). At expiration of the interval 406, the voltage 404 across the pass transistor 102 exceeds the offset voltage generated by the offset voltage source 206 and current 234 flowing in the transistor 216 increases with the current 230 over interval 408. During the interval 408, the control current 114 is a sum of the fixed current generated by the current source 218 and the increasing current 234 flowing in the transistor 216. At time 410, the current 234 flowing in the transistor 216 is equal to a maximum value of current set by the current source 220, and the control current 114 is at its maximum value. The gate-to-source voltage 402 of the pass transistor 102 is controlled by the control current 114 and remains at a voltage determined by the control current 114 even though the current 230 continues to increase.

Figure 5:
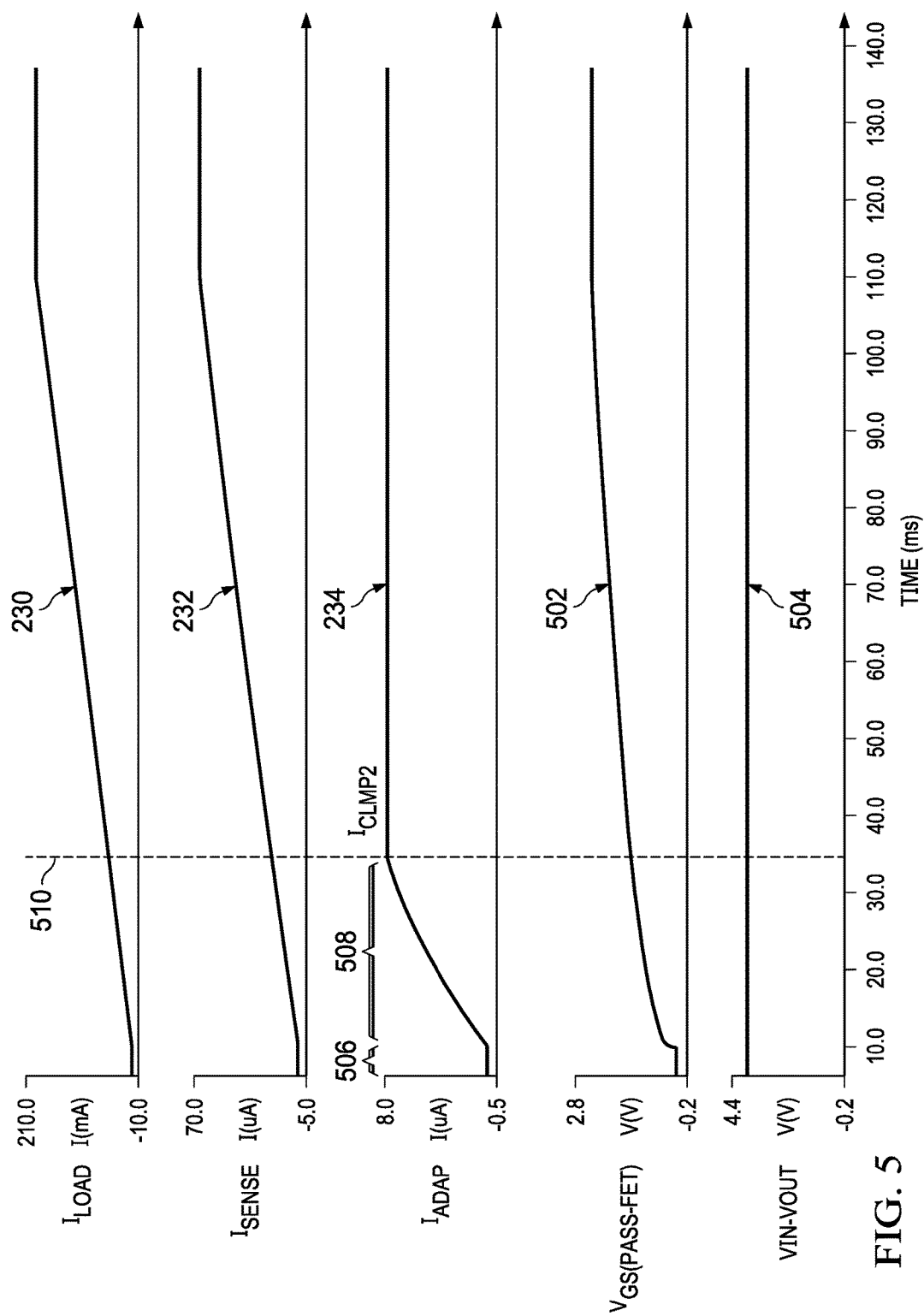
FIG. 5 shows signals in the sense circuitry of FIG. 2 when employed in a low drop out regulator that is operating in regulation.

FIG. 5 shows signals in the sense circuitry 200 when employed in a low drop out regulator 100 that is operating in regulation. In FIG. 5, the voltage 504 across the pass transistor 102 is high enough to enable regulation of the output voltage. The current 230 flowing in the pass transistor 102 is rising. In the interval 506, the voltage 504 across the pass transistor 102 exceeds the offset voltage generated by the offset voltage source 206, but little or no current is flowing through the pass transistor 102, and similarly, the current 232 is approximately zero. As a result, the current source 218 alone sets the control current 114 for controlling the resistance of the pass transistor 102 (i.e., no current flows in the transistor 216). At expiration of the interval 506, the current 230 has increased, which in turn increases the current 232 and the current 234 over interval 508. During the interval 508, the control current 114 is a sum of the fixed current generated by the current source 218 and the increasing current 234 flowing in the transistor 216. At time 510, the current 234 flowing in the transistor 216 is equal to a maximum value of current set by the current source 220, and the control current 114 is at its maximum value. After time 510, the gate-to-source voltage 502 of the pass transistor 102 continues to increase with the current 230 under the control of the error amplifier 112.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A low dropout regulator circuit, comprising:
    a pass transistor;
    a first sense transistor;
    a second sense transistor;
    a driver circuit coupled to, and configured to generate a drive signal to control, the pass transistor, the first sense transistor, and the second sense transistor;
    sense circuitry coupled to the pass transistor, the first sense transistor, and the second sense transistor, and comprising:
        a first sense circuit configured to generate an output current proportional to a current flowing in the pass transistor; and
        a second sense circuit coupled to the driver circuit and configured to set the drive signal to a predetermined voltage responsive to a voltage across the pass transistor being less than a threshold voltage; and
    an error amplifier coupled to the pass transistor and the driver circuit, and configured to control a voltage at an output of the pass transistor.

2. The low dropout regulator circuit of claim 1, wherein the first sense circuit comprises:
    an amplifier coupled to the pass transistor and the first sense transistor; and
    a transistor controlled by the amplifier to pass the output current proportional to the current flowing in the pass transistor.

3. The low dropout regulator circuit of claim 1, wherein the second sense circuit comprises:
    an output terminal coupled to the driver circuit; and
    a fixed current source coupled to the output terminal, and configured to generate a fixed current in the output terminal.

4. The low dropout regulator circuit of claim 3, wherein the second sense circuit further comprises a variable current source coupled to the output terminal in parallel with the fixed current source, and configured to:

generate no current in the output terminal responsive to the voltage across the pass transistor being less than the threshold voltage; and generate a current in the output terminal that is proportional to the current flowing in the pass transistor responsive to the voltage across the pass transistor being greater than the threshold voltage.

5. The low dropout regulator circuit of claim 3, wherein the second sense circuit further comprises:

an amplifier coupled to the pass transistor and the second sense transistor; and a transistor controlled by the amplifier to pass a sense current responsive to the voltage across the pass transistor being greater than the threshold voltage.

6. The low dropout regulator circuit of claim 3, wherein the fixed current is a minimum current in the output terminal and the second sense circuit is configured to generate a predetermined maximum current in the output terminal responsive to the sense current being greater than an upper threshold current.

7. The low dropout regulator circuit of claim 1, wherein the error amplifier is coupled to the pass transistor and the driver circuit, and configured to provide, to the driver circuit, an error signal that is representative of difference in a voltage output by the pass transistor and a reference voltage.

8. A current sensing circuit, comprising:
a pass transistor;
a first sense transistor;
a second sense transistor;
a driver circuit coupled to and configured to generate a drive signal to control the pass transistor, the first sense transistor, and the second sense transistor;
sense circuitry coupled to the pass transistor, the first sense transistor, and the second sense transistor, and comprising:
a first sense circuit configured to generate an output current proportional to a current flowing in the pass transistor; and
a second sense circuit coupled to the driver circuit and configured to set the drive signal to a predetermined voltage responsive to a voltage across the pass transistor being less than a threshold voltage.

9. The current sensing circuit of claim 8, wherein the first sense circuit comprises:
an amplifier coupled to the pass transistor and the first sense transistor; and
a transistor controlled by the amplifier to pass the output current proportional to the current flowing in the pass transistor.

10. The current sensing circuit of claim 8, wherein the second sense circuit comprises:
an output terminal coupled to the driver circuit; and
a fixed current source coupled to the output terminal, and configured to generate a fixed current in the output terminal.

11. The current sensing circuit of claim 10, wherein the second sense circuit further comprises a variable current source coupled to the output terminal in parallel with the fixed current source, and configured to:
generate no current in the output terminal responsive to the voltage across the pass transistor being less than the threshold voltage; and
generate a current in the output terminal that is proportional to the current flowing in the pass transistor responsive to the voltage across the pass transistor being greater than the threshold voltage.

12. The current sensing circuit of claim 10, wherein the second sense circuit further comprises:
an amplifier coupled to the pass transistor and the second sense transistor; and
a transistor controlled by the amplifier to pass a sense current responsive to the voltage across the pass transistor being greater than the threshold voltage.

13. The current sensing circuit of claim 10, wherein the fixed current is a minimum current in the output terminal and the second sense circuit is configured to generate a predetermined maximum current in the output terminal responsive to the sense current being greater than an upper threshold current.

14. A current sensing circuit, comprising:
a first transistor;
a second transistor, comprising:
a first terminal coupled to a first terminal of the first transistor; and
a second terminal coupled to a second terminal of the first transistor;
a third transistor, comprising:
a first terminal coupled to the first terminal of the first transistor; and
a second terminal coupled to the second terminal of the first transistor;
a driver circuit comprising a first terminal coupled to the first terminal of the first transistor;
a first sense circuit comprising:
a first terminal coupled to a third terminal of the first transistor; and
a second terminal coupled to a third terminal of the second transistor; and
a second sense circuit comprising:
a first terminal coupled to the third terminal of the first transistor;
a second terminal coupled to a third terminal of the third transistor; and
a third terminal coupled to a second terminal of the driver circuit.

15. The current sensing circuit of claim 14, wherein the first sense circuit comprises:
an amplifier, comprising:
a first terminal coupled to a third terminal of the first transistor; and
a second terminal coupled to a third terminal of the second transistor; and
a fourth transistor, comprising:
a first terminal coupled to the second terminal of the amplifier; and
a second terminal coupled to a third terminal of the amplifier.

16. The current sensing circuit of claim 14, further comprising a first current source coupled to the second terminal of the driver circuit.

17. The current sensing circuit of claim 14, wherein the second sense circuit further comprises:
a voltage source comprising a first terminal coupled to a third terminal of the third transistor;
an amplifier comprising:
a first terminal coupled to a third terminal of the first transistor; and
a second terminal coupled to a second terminal of the voltage source;
a fourth transistor, comprising:
a first terminal coupled to the first terminal of the voltage source; and a second terminal coupled to a third terminal of the amplifier.

18. The current sensing circuit of claim 17, further comprising:
a fifth transistor comprising:
a first terminal coupled to a third terminal of the fourth transistor;
a second terminal coupled to the third terminal of the fourth transistor; and
a current source coupled to a third terminal of the fifth transistor.

19. The current sensing circuit of claim 18, further comprising:
a sixth transistor comprising:
a first terminal coupled to a third terminal of the fourth transistor; and
a second terminal coupled to the second terminal of the driver circuit; and
a current source coupled to a third terminal of the sixth transistor.

20. The current sensing circuit of claim 19, further comprising a seventh transistor comprising:
a first terminal coupled to the first terminal of the fifth transistor and the fifth terminal of the sixth transistor; and
a second terminal coupled to ground.

* * * * *